United States Patent
Saxler

(10) Patent No.: US 9,142,617 B2
(45) Date of Patent: Sep. 22, 2015

(54) WIDE BANDGAP DEVICE HAVING A BUFFER LAYER DISPOSED OVER A DIAMOND SUBSTRATE

(71) Applicant: Cree, Inc., Durham, NC (US)

(72) Inventor: Adam William Saxler, Durham, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/948,675

(22) Filed: Jul. 23, 2013

(65) Prior Publication Data

US 2013/0306990 A1 Nov. 21, 2013

Related U.S. Application Data

(62) Division of application No. 12/952,278, filed on Nov. 23, 2010, now Pat. No. 8,513,672, which is a division of application No. 12/504,725, filed on Jul. 17, 2009, now Pat. No. 7,863,624, which is a division of application No. 11/347,953, filed on Feb. 6, 2006, now Pat. No. 7,579,626, which is a division of application No. 10/707,898, filed on Jan. 22, 2004, now Pat. No. 7,033,912.

(51) Int. Cl.
- H01L 29/778 (2006.01)
- H01L 29/16 (2006.01)
- H01L 21/02 (2006.01)

(52) U.S. Cl.
CPC ........ *H01L 29/1602* (2013.01); *H01L 21/0254* (2013.01); *H01L 21/02378* (2013.01); *H01L 21/02527* (2013.01); *H01L 29/778* (2013.01)

(58) Field of Classification Search
USPC .......................................................... 257/76
See application file for complete search history.

(56) References Cited

U.S. PATENT DOCUMENTS

| | | |
|---|---|---|
| 2,938,136 A | 5/1960 | Fischer |
| 5,006,914 A | 4/1991 | Beetz, Jr. |
| 5,030,583 A | 7/1991 | Beetz, Jr. |
| 5,210,051 A | 5/1993 | Carter, Jr. |
| 5,311,055 A | 5/1994 | Goodman et al. |

(Continued)

FOREIGN PATENT DOCUMENTS

| | | |
|---|---|---|
| CN | 1467862 A | 1/2004 |
| JP | 3295267 A | 12/1991 |

(Continued)

OTHER PUBLICATIONS

Cellar, G.K., "Frontiers of Silicon-On-Insulator," Journal of Applied Physics, vol. 93, No. 9, May 1, 2003, p. 4955.

(Continued)

*Primary Examiner* — Stephen W Smoot
(74) *Attorney, Agent, or Firm* — Anthony J. Josephson

(57) ABSTRACT

A high power, wide-bandgap device is disclosed that exhibits reduced junction temperature and higher power density during operation and improved reliability at a rated power density. The device includes a diamond substrate for providing a heat sink with a thermal conductivity greater than silicon carbide, a single crystal silicon carbide layer on the diamond substrate for providing a supporting crystal lattice match for wide-bandgap material structures that is better than the crystal lattice match of diamond, and a Group III nitride heterostructure on the single crystal silicon carbide layer for providing device characteristics.

13 Claims, 3 Drawing Sheets

(56) References Cited

U.S. PATENT DOCUMENTS

| | | | |
|---|---|---|---|
| 5,373,171 | A | 12/1994 | Imai et al. |
| 5,382,822 | A | 1/1995 | Stein |
| 5,393,993 | A | 2/1995 | Edmond et al. |
| 5,422,901 | A | 6/1995 | Lebby et al. |
| 5,455,457 | A | 10/1995 | Kurokawa |
| 5,523,589 | A | 6/1996 | Edmond et al. |
| 5,661,312 | A | 8/1997 | Weitzel et al. |
| 5,803,967 | A | 9/1998 | Plano et al. |
| 5,872,415 | A | 2/1999 | Dreifus et al. |
| 6,150,239 | A | 11/2000 | Goesele et al. |
| 6,156,581 | A | 12/2000 | Vaudo et al. |
| 6,218,680 | B1 | 4/2001 | Carter, Jr. et al. |
| 6,255,712 | B1 | 7/2001 | Clevenger et al. |
| 6,316,793 | B1 * | 11/2001 | Sheppard et al. .............. 257/103 |
| 6,316,826 | B1 | 11/2001 | Yamamoto et al. |
| 6,396,080 | B2 | 5/2002 | Carter, Jr. et al. |
| 6,396,864 | B1 | 5/2002 | O'Brien et al. |
| 6,403,982 | B2 | 6/2002 | Carter, Jr. et al. |
| 6,497,763 | B2 * | 12/2002 | Kub et al. ........................ 117/94 |
| 6,507,046 | B2 | 1/2003 | Mueller |
| 6,533,874 | B1 | 3/2003 | Vaudo et al. |
| 6,548,333 | B2 | 4/2003 | Smith |
| 6,583,454 | B2 | 6/2003 | Sheppard et al. |
| 6,586,781 | B2 | 7/2003 | Wu et al. |
| 6,634,770 | B2 | 10/2003 | Cao |
| 6,639,247 | B2 | 10/2003 | Carter, Jr. et al. |
| 6,670,693 | B1 | 12/2003 | Quick |
| 6,686,676 | B2 | 2/2004 | McNulty et al. |
| 6,692,568 | B2 | 2/2004 | Cuomo et al. |
| 6,757,314 | B2 | 6/2004 | Kneissl et al. |
| 6,867,067 | B2 | 3/2005 | Ghyselen et al. |
| 7,863,624 | B2 | 1/2011 | Saxler |
| 2002/0078881 | A1 | 6/2002 | Cuomo et al. |
| 2002/0086534 | A1 | 7/2002 | Cuomo et al. |
| 2002/0096104 | A1 | 7/2002 | Yagi et al. |
| 2002/0096106 | A1 | 7/2002 | Kub et al. |
| 2002/0100412 | A1 | 8/2002 | Hirayama et al. |
| 2002/0117695 | A1 | 8/2002 | Borges et al. |
| 2002/0123204 | A1 | 9/2002 | Torvik |
| 2002/0167023 | A1 | 11/2002 | Chavarkar et al. |
| 2002/0180351 | A1 | 12/2002 | McNulty et al. |
| 2002/0182779 | A1 | 12/2002 | Bewley et al. |
| 2003/0025198 | A1 | 2/2003 | Chrysler et al. |
| 2003/0096507 | A1 | 5/2003 | Baker et al. |
| 2003/0102482 | A1 | 6/2003 | Saxler |
| 2003/0107045 | A1 | 6/2003 | Eisert et al. |
| 2003/0127654 | A1 | 7/2003 | Eisert et al. |
| 2003/0219959 | A1 | 11/2003 | Ghyselen et al. |
| 2004/0009649 | A1 | 1/2004 | Kub et al. |
| 2004/0023468 | A1 | 2/2004 | Ghyselen et al. |
| 2004/0051141 | A1 | 3/2004 | Udrea |

FOREIGN PATENT DOCUMENTS

| | | |
|---|---|---|
| JP | H09181355 A | 7/1997 |
| JP | H10294452 A | 11/1998 |
| JP | 2000058562 | 2/2000 |
| JP | 2002265296 A | 9/2002 |
| JP | 2003037074 A | 2/2003 |
| JP | 2003257804 A | 9/2003 |
| WO | 0243124 A2 | 5/2002 |
| WO | 03012864 A1 | 2/2003 |
| WO | 03036699 A2 | 5/2003 |

OTHER PUBLICATIONS

Elhamri, S. et al., "Persistent Photoconductivity in a High Mobility Two Dimensional Electron Gas in an AiGaN/GaN Heterostructure," Journal of Applied Physics, vol. 88, Issue 11, Dec. 2000, pp. 6583-6588.

Gaskill, D.K., "Summary of the Workshop on Bonded and Compliant Substrates," MRS Internet Journal, Nitride Semiconductor Research, Mar. 4, 1998, 2 pages.

Moriceau, H. et al., "New Layer Transfers Obtained by the SmartCut Process," Journal of Electronic Materials, vol. 32, No. 8, Copyright: 2003, pp. 829-835.

Pribble, W.L. et al., "Applications of SiC MESFETs and GaN HEMT's in Power Amplifier," 2002 IEEE MTT-S Digest, vol. 3, Jun. 2-7, 2002, pp. 1819-1822.

Saxler, A. et al., "Electroluminescence of III-Nitride Double Heterostructure Light Emitting Diodes with Silicon and Magnesium Doped InGaN," Materials Science Forum, vols. 258-263, Copyright: 1997, pp. 1229-1234.

Notice of Allowance for U.S. Appl. No. 10/707,898, mailed Nov. 18, 2005, 6 pages.

Notice of Allowance for U.S. Appl. No. 10/707,898, mailed Mar. 15, 2006, 2 pages.

Non-Final Office Action for U.S. Appl. No. 10/707,898, mailed Sep. 7, 2005, 6 pages.

Restriction Requirement for U.S. Appl. No. 10/707,898, mailed Jun. 9, 2005, 5 pages.

Restriction Requirement for U.S. Appl. No. 10/707,898, mailed Mar. 3, 2005, 6 pages.

Restriction Requirement for U.S. Appl. No. 11/347,953, mailed Jun. 20, 2008, 6 pages.

Non-Final Office Action for U.S. Appl. No. 11/347,953, mailed Sep. 8, 2008, 9 pages.

Notice of Allowance for U.S. Appl. No. 11/347,953, mailed Apr. 16, 2009, 7 pages.

Restriction Requirement for U.S. Appl. No. 12/504,725, mailed Feb. 5, 2010, 6 pages.

Non-Final Office Action for U.S. Appl. No. 12/504,725, mailed Apr. 6, 2010, 11 pages.

Notice of Allowance for U.S. Appl. No. 12/504,725, mailed Aug. 25, 2010, 7 pages.

Non-Final Office Action for U.S. Appl. No. 12/952,278, mailed Apr. 9, 2012, 7 pages.

Final Office Action for U.S. Appl. No. 12/952,278, mailed Aug. 3, 2012, 8 pages.

Advisory Action for U.S. Appl. No. 12/952,278, mailed Oct. 10, 2012, 3 pages.

Notice of Allowance for U.S. Appl. No. 12/952,278, mailed Jan. 14, 2013, 8 pages.

Notice of Allowance for U.S. Appl. No. 12/952,278, mailed Apr. 18, 2013, 9 pages.

Japanese Office Action for Patent Application No. 2006-551378, mailed Oct. 17, 2011, 3 pages.

Shen, L. et al., "AlGaN/AlN/GaN High-Power Microwave HEMT" IEEE Electron Device Letters, vol. 22, No. 10, Oct. 2001, pp. 457-459.

Reason for Rejection for Japanese Patent Application No. 2012-148508, mailed Jan. 29, 2014, 4 pages.

Notice of Reason for Rejection for Japanese Patent Application No. 2012-148508, mailed Oct. 24, 2014, 5 pages.

Examination Report for European Patent Application No. 05 706 059.2, mailed May 11, 2015, 3 pages.

* cited by examiner

WIDE BANDGAP DEVICE HAVING A BUFFER LAYER DISPOSED OVER A DIAMOND SUBSTRATE

RELATED APPLICATIONS

The present application is a divisional application of U.S. Pat. No. 8,513,672, entitled WAFER PRECURSOR PREPARED FOR GROUP III NITRIDE EPITAXIAL GROWTH ON A COMPOSITE SUBSTRATE HAVING DIAMOND AND SILICON CARBIDE LAYERS, AND SEMICONDUCTOR LASER FORMED THEREON, which issued on Aug. 20, 2013; which was a divisional application of U.S. Pat. No. 7,863,624, entitled SILICON CARBIDE ON DIAMOND SUBSTRATES AND RELATED DEVICES AND METHODS, which issued on Jan. 4, 2011; which was a divisional application of U.S. Pat. No. 7,579,626, entitled SILICON CARBIDE LAYER ON DIAMOND SUBSTRATE FOR SUPPORTING GROUP III NITRIDE HETEROSTRUCTURE DEVICE, which issued on Aug. 25, 2009; which was a divisional application of U.S. Pat. No. 7,033,912, entitled SILICON CARBIDE ON DIAMOND SUBSTRATES AND RELATED DEVICES AND METHODS, which issued on Apr. 25, 2006, the disclosure of which is hereby incorporated herein in its entirety by reference.

BACKGROUND

The present invention relates to semiconductor devices formed of materials that make them suitable for high power, high temperature, and high frequency applications. As known to those familiar with semiconductors, materials such as silicon (Si) and gallium arsenide (GaAs) have found wide application in semiconductor devices for lower power and (in the case of Si) lower frequency applications. These semiconductor materials have failed to penetrate higher power high frequency applications to the extent desirable, however, because of their relatively small bandgaps (e.g., 1.12 eV for Si and 1.42 for GaAs at room temperature) and relatively small breakdown voltages.

Accordingly, interest in high power high temperature and high frequency applications and devices has turned to wide bandgap semiconductor materials such as silicon carbide (2.996 eV for alpha SiC at room temperature) and the Group III nitrides (e.g., 3.36 eV for gallium nitride at room temperature). These materials have higher electric field breakdown strengths and higher electron saturation velocities as compared to gallium arsenide and silicon.

Because of their wide and direct bandgap characteristics, the Group III nitride semiconductors are candidates for many applications including solar blind photodetectors, blue light emitting and laser diodes, and high temperature and high power electronics. The gallium nitride-aluminum gallium nitride (GaN/AlGaN) heterostructure has attracted special interest because of its potential applications in high mobility transistors operating at high powers and high temperatures.

In addition to other advantages, gallium nitride transistors can theoretically or in actuality demonstrate several times the power density as compared to gallium arsenide. Such higher power density permits smaller chips to handle the same amount of power which in turn provides the opportunity to reduce chip size and increasing number of chips per wafer, and thus lower the cost per chip. Alternatively, similarly sized devices can handle higher power thus providing size reduction advantages where such are desirable or necessary.

As an exemplary driving force for higher-frequency, higher-power devices, cellular telephone equipment is rapidly becoming a large market for semiconductors, potentially exceeding even that of personal computers. This increase is driving a corresponding demand for the supporting infrastructures to provide greater capabilities and performance. Expected changes include the use of higher and higher frequencies for obtaining appropriate spectrum space; e.g., from 900 MHz to higher frequencies including 2.1 GHz. Such higher frequency signals accordingly require higher power levels.

A high frequency high power device of particular interest is the high electron mobility transistor (HEMT), and related devices such as a modulation doped field effect transistor (MODFET), or a heterojunction field effect transistor (HFET). These devices offer operational advantages under a number of circumstances because a two-dimensional electron gas (2 DEG) is formed at the heterojunction of two different semiconductor materials with different bandgap energies, and where the smaller bandgap material has a higher electron affinity. The 2 DEG is an accumulation layer in the undoped, smaller bandgap material and can contain a very high sheet electron concentration on the order of 1012 to 1013 carriers per square centimeter (cm-2). Additionally, electrons that originate in the doped, wider-bandgap material transfer to the 2 DEG, allowing a high electron mobility due to reduced ionized impurity scattering. In exemplary Group III nitride HEMTs, the two dimensional electron gas resides at the interface of a gallium nitride/aluminum gallium nitride heterostructure.

This combination of high carrier concentration and high carrier mobility gives the HEMT a very large transconductance and a strong performance advantage over metal semiconductor field effect transistors (MESFETs) for high-frequency applications. High electron mobility transistors fabricated in the gallium nitride/aluminum gallium nitride (GaN/AlGaN) material system have the potential to generate large amounts of RF power because of their unique combination of material characteristics which includes the aforementioned high breakdown fields, wide bandgaps, large conduction band offset, and high saturated electron drift velocity.

Descriptions of recent progress in this field include, but are not limited to, U.S. Pat. Nos. 6,586,781; 6,548,333; and 6,316,793; and published applications Nos. 20020167023 and 20030102482, the contents of each of which are incorporated entirely herein by reference. Related publications include Pribble et al., Applications of SiC MESFETs and GaN HEMTs in Power Amplifier Design, International Microwave Symposium Digest, 30: 1819-1822 (2002).

High power semiconducting devices of this type operate in a microwave frequency range and are used for RF communication networks and radar applications and, as noted above, offer the potential to greatly reduce the complexity and thus the cost of cellular phone base station transmitters. Other potential applications for high power microwave semiconductor devices include replacing the relatively costly tubes and transformers in conventional microwave ovens, increasing the lifetime of satellite transmitters, and improving the efficiency of personal communication system base station transmitters.

As the output power and operational frequency of these devices continue to improve, the corresponding amount of heat generated from the device, and in turn from multi-device chips and circuits, has been and will continue to increase. Additionally, the design and market-generated goals for such devices include a continued reduction in size and weight of such electronic components. Therefore, packaging density has increased and will continue to increase. As a result, some accommodation must be included to carry off excess heat or to otherwise moderate the effects of heat on operating devices.

Excessive heat can raise several problems. Conductivity decreases at higher temperatures while maximum frequency and maximum power both decrease. Higher temperatures also permit more tunneling and leaking that reduce device performance, and accelerate degradation and device failure. Stated more positively, improved thermal management can provide higher frequency operation and higher power density during a rated device lifetime.

For several crystal growth-related reasons, bulk (i.e., reasonably large size) single crystals of Group III nitrides are, for practical purposes, unavailable. Accordingly, Group III nitride devices are typically formed on other bulk substrate materials, most commonly sapphire (Al2O3) and silicon carbide (SiC). Sapphire is relatively inexpensive and widely available, but is a poor thermal conductor and therefore unsuitable for high-power operation. Additionally, in some devices, conductive substrates are preferred and sapphire lacks the capability of being conductively doped.

Silicon carbide has a better thermal conductivity than sapphire, a better lattice match with Group III nitrides (and thus encourages higher quality epilayers), and can be conductively doped, but is also much more expensive. Furthermore, although progress has been made in designing and demonstrating GaN/AlGaN HEMTs on silicon carbide (e.g., the patents and published applications cited above) a lack of consistent reliability at desired rated performance parameters continues to limit commercial development.

Accordingly, the need exists for continued improvement in high frequency high power semiconductor based microwave devices.

SUMMARY

In one aspect, the invention is a method of forming a high-power, high-frequency device in wide bandgap semiconductor materials with reduced junction temperature, higher power density during operation or improved reliability at a rated power density or any combination of these advantages. In this aspect, the invention comprises adding a layer of diamond to a silicon carbide wafer to increase the thermal conductivity of the resulting composite wafer, thereafter reducing the thickness of the silicon carbide portion of the composite wafer while retaining sufficient thickness of silicon carbide to support epitaxial growth thereon, preparing the silicon carbide surface of the composite wafer for epitaxial growth thereon, and adding a Group III nitride heterostructure to the prepared silicon carbide face of the wafer.

In another aspect, the invention is a high-power, wide-bandgap device that exhibits reduced junction temperature and higher power density during operation and improved reliability at a rated power density. In this aspect, the invention comprises a diamond substrate for providing a heat sink with a thermal conductivity greater than silicon carbide, a single crystal silicon carbide layer on the diamond substrate for providing a supporting crystal lattice match for wide-bandgap material structures that is better than the crystal lattice match of diamond, and a Group III nitride heterostructure on the single crystal silicon carbide layer for providing device characteristics.

In yet another aspect, the invention is a wide bandgap high electron mobility transistor (HEMT) comprising a diamond substrate for providing a heat sink with a thermal conductivity greater than that of an equivalent amount of silicon carbide, a semi-insulating silicon carbide single crystal layer on the diamond substrate for providing a favorable crystal growth surface for Group III nitride epilayers (the terms "epitaxial layer" and "epilayer" are used interchangeably herein), a first epitaxial layer of a first Group III nitride on the silicon carbide substrate, a second epitaxial layer of a different Group III nitride on the first epitaxial layer for forming a heterojunction with said first epilayer, and with the Group III nitride of the second epilayer having a wider bandgap than the first Group III nitride of the first epilayer for generating a two dimensional electron gas (2 DEG) in the first epilayer at the interface of the first and second epilayers, and respective source and drain contacts to the second epitaxial Group III nitride epilayer for providing a flow of electrons between the source and drain that is controlled by a voltage applied to the gate.

In yet another aspect, the invention is a wafer precursor for semiconductor devices comprising a substrate of single crystal silicon carbide that is at least two inches in diameter, a layer of diamond on a first face of the silicon carbide substrate, and a second face that is prepared for growth of a Group III nitride epilayer or active structure.

In yet another aspect, the invention is a semiconductor laser comprising a diamond substrate, a single crystal silicon carbide layer on the diamond substrate, at least a first cladding layer on the silicon carbide layer, a Group III nitride active portion, and at least a second cladding layer on the active portion.

The foregoing and other objects and advantages of the invention and the manner in which the same are accomplished will become clearer based on the followed detailed description taken in conjunction with the accompanying drawings.

DETAILED DESCRIPTION

It will be understood that the advantages of the invention as described herein are neither exclusive of one another nor are they necessarily cumulative. Thus, by reducing the junction temperature, higher power density can be achieved at a given rated reliability, or the reliability can be increased at a previously-available rated power density, or some combination of these (and other) advantages can be achieved.

Figure 1:
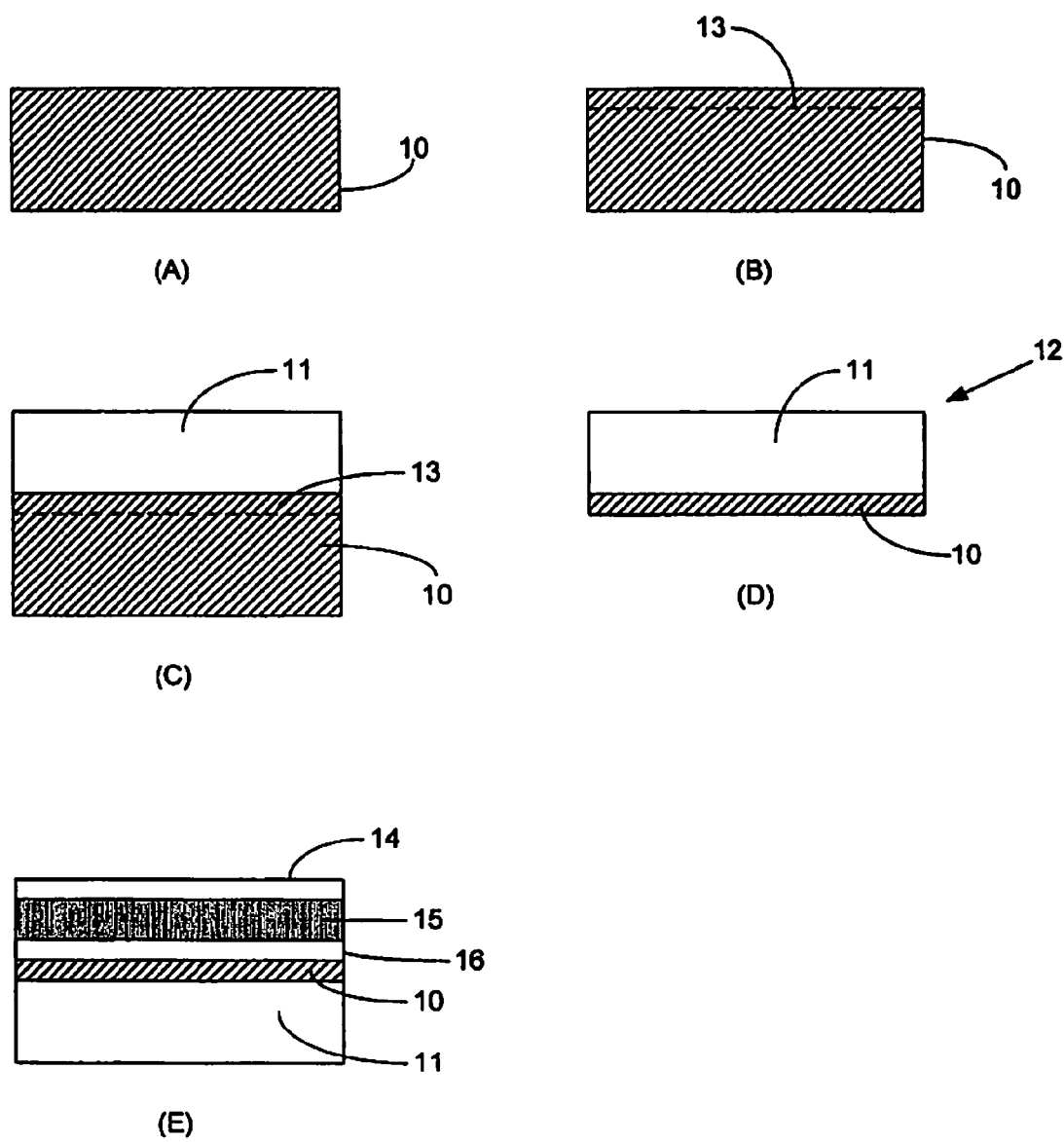
FIG. 1 (A) through 1 (E) are schematic cross-sectional views of a sequence of steps illustrating the method of the invention.

In a first embodiment, the invention is a method of forming a high-powered device in wide bandgap materials with reduced junction temperature, higher power density during operation, and improved reliability at a rated power density. The method is illustrated schematically in FIG. 1 which includes sub-Figures (A) through (E). FIG. 1 illustrates a silicon carbide wafer 10. In preferred embodiments and as is most useful for device structures, the silicon carbide wafer or substrate 10 is a single crystal layer that provides a highly suitable substrate for the Group III nitride epitaxial layers and resulting devices that are one of the principal objects of this invention. The term "wafer" is used in a broad sense herein and is not limited to common shapes and sizes.

FIG. 1 (C) illustrates the next step in the method of the invention which is that of adding a layer of diamond II to the silicon carbide substrate 10. The diamond portion 11 increases the thermal conductivity of the resulting composite wafer, because the thermal conductivity of diamond (20 watts per centimeter per degree Kelvin (W/cm-K)) is approximately four times that of silicon carbide (4.9 W/cm-K). In preferred embodiments, the silicon carbide wafer is prepared for the diamond deposition by a chemical-mechanical polishing step (CMP). This can help improve the surface morphology of the grown diamond, and is most preferably carried out on the C-face of the SiC.

FIG. 1(D) illustrates that the next step is that of reducing the thickness of the silicon carbide portion of the composite wafer that is now broadly designated at 12. A sufficient thickness of silicon carbide is retained to support epitaxial growth on the silicon carbide while retaining the desired lattice matching characteristics of silicon carbide. Preferably, the thickness is reduced as much as possible; i.e., minimized, while remaining sufficient to provide the desired lattice matching for the nitride epilayers. As recognized by those of relevant ("ordinary") skill in this art, the lattice constants of silicon carbide are not necessarily identical to those of the Group III nitrides, but are closer than those of diamond. Stated differently, and as noted above, large size Group 111 nitride single crystal substrates are currently unavailable from a practical standpoint. Accordingly, some other material is typically used as the substrate, and for a number of reasons, silicon carbide is preferred and indeed from a lattice constant matching standpoint, is better than diamond. Thus, those familiar with the growth of epitaxial layers of Group III nitrides on silicon carbide will recognize that the lattice constants do not need to match identically, but need to be favorably close enough to encourage the desired high quality single crystal growth.

FIG. 1(B) illustrates one of the methods for reducing the thickness of the silicon carbide portion. In a preferred embodiment the silicon carbide substrate 10 is implanted with oxygen at a predetermined depth in the silicon carbide to form a layer of silicon dioxide (SiO2) indicated as the dotted line 13. In this technique, the diamond layer 11 is added next as previously described with respect to FIG. 1(C). After the diamond has been deposited, the thickness of the silicon carbide portion 10 is reduced by separating the silicon carbide at the silicon dioxide layer. This results in the structure illustrated in FIG. 1(D). This technique is also referred to as "SIMOX" ("separation by implantation of oxygen") and can include a heating step to further encourage the production of SiO2 from the implanted oxygen.

Alternatively, the step of reducing the thickness of the silicon carbide portion can comprise the more conventional steps of lapping and polishing. As is recognized by those familiar with this art, however, the SiC-reducing step (or steps) need to be consistent with the remainder of the device manufacturing steps. Thus, overly aggressive mechanical steps that would harm or defeat the purpose of the diamond layer or of the resulting device are preferably avoided.

The use of ion implantation with other elements or ions (e.g. H+) followed by separation at the implanted material is becoming more well understood in the art and has been referred to as the "Smart Cut" process which was first developed to obtain silicon-on-insulator materials. Background sources on this technique are available, with a recent discussion being set forth by Moriceau et al., "New Layer Transfers Obtained by the Smart Cut Process," Journal Of Electronic Materials, Vol. 32, No. 8, pages 829-835 (2003) and Celler et al., "Frontiers of Silicon-on-Insulator," Journal of Applied Physics, Vol. 93, No. 9, pages 4955ff (2003). It will be understood that these references are included for exemplary rather than limiting purposes.

Alternatively, the separation can be carried out using a thermal stress technique in which the wafer, having been implanted and following diamond growth, is cooled at a rate sufficient to separate the wafer at the implanted portion, but less than the cooling rate at which the wafer would shatter. This separation could also be carried out between diamond growth steps as may be desired or necessary.

In preferred embodiments, the diamond layer is added to the carbon face of the silicon carbide wafer and the silicon face is reserved for the steps of preparing the silicon carbide surface of the composite wafer 12 for epitaxial growth followed by the step of adding a Group III nitride heterostructure to the prepared silicon carbide face of the wafer. Thus, the heterostructure is added to the silicon face of the composite wafer. The step is illustrated in FIG. 1 (E) in which the orientation of the diamond portion 11 and the reduced thickness silicon carbide 10 have been flipped between FIGS. 1 (D) and (E) so that the diamond 11 becomes the substrate with a layer of silicon carbide 10 upon it. FIG. 1 (E) also illustrates a heterostructure formed of two different Group III nitrides the top portion of which is designated at 14 and a lower portion at 15. FIG. 1 also illustrates that in most embodiments, a buffer layer 16 will be included between the silicon carbide layer 10 and the heterostructure layers 14 and 15. As typical, but not exclusive, examples, the heterostructure layers are formed of aluminum gallium nitride (the top layer 14) and gallium nitride (the middle layer 15), with aluminum nitride being selected for the buffer layer 16. Appropriate buffer layers, heterostructures, growth methods and other relevant information are set forth for example in the patents noted earlier, as well as in U.S. Pat. Nos. 5,393,993; 5,210, 051; and 5,523,589, which are commonly assigned with the present invention, and all of which are incorporated entirely herein by reference.

As an additional consideration, however, the various CYD source gases and equipment used to produce the buffer (if any) and the heterostructure layers should be selected to be compatible with the diamond. Stated differently, the source gases, equipment and related items should be selected to avoid any undesired reaction with or effect upon the diamond.

If desired, the diamond can be annealed to increase its insulating characteristics. The annealing can be carried out in a furnace or in a diamond deposition chamber prior to growth of the Group III nitride epilayers, or in the epilayer reactor prior to epilayer growth, or during epilayer growth. Improved results have been observed when ammonia (NH3), hydrogen (H2) and nitrogen (N2) are used as ambient gases during the anneal. The reasons for such improvement are as yet undetermined, and thus the inventors do not wish to be bound by any particular theory on this point.

In some embodiments, the diamond layer can be bonded to the silicon carbide and these techniques are generally well understood in the art. In brief summary, bonding typically comprises placing the desired materials in contact with one another while applying pressure and heat. In more preferred embodiments, however, the diamond is deposited on the silicon carbide by chemical vapor deposition. Chemical vapor deposition of diamond has become more widely commercially available in recent years and exemplary services and equipment are available from sources such as PI Diamond Inc. of Santa Clara, Calif., or Delaware Diamond Knives ("DDK") of Wilmington, Del. Because the diamond is included for its thermal properties, and because the silicon carbide provides the crystal lattice matching, the diamond can be deposited in polycrystalline form. Although single crystal diamond will provide somewhat better thermal management benefits, it is, like all single crystals, generally more difficult or complex to produce than polycrystalline material. Thus, the use of poly crystalline diamond is somewhat more convenient to carry out. As well understood by those in the art, chemical vapor deposition of diamond is typically produced by energizing mixtures of hydrogen and hydrocarbon gases with heat or electrical energy in a deposition reactor. The energy, source materials, and related parameters can all be adjusted in a suitable or desired manner; e.g., www.p1diamond.com and www.dd.k.com. Whenever possible, isotopically pure diamond (i.e., all 12C) is also preferred over the naturally occurring isotope distribution, which contains about one percent of 13C.

Furthermore, the diamond/SiC interface should have minimal thermal resistance, and thus where processes such as bonding are used, any voids between the diamond and the SiC should be minimized or eliminated.

The diamond is deposited to a thickness that is sufficient to support the added heterostructure while avoiding additional material that fails to provide further functional benefit. Stated differently, once a sufficient amount of diamond has been included to provide the required or desired thermal characteristics and mechanical support for the particular wafer or device, merely adding further diamond offers no further advantage or functional benefit. In preferred embodiments, an appropriate diamond layer has a thickness of between about 100 and 300 microns (μm) for the type of heterostructure Group III nitride devices for which the invention is particularly suited.

Because, however, devices are typically manufactured in multiple step processes, the invention can further comprise depositing two (or more) layers of diamond (or one layer of diamond and another layer of a second material) that differ in properties from one another. The purpose of adding the additional layer (or layers) is to provide one that has the thermal conductivity characteristics for the final device, while having additional (even if temporary) layers present for manufacturing purposes that can be removed later. Thus, in this aspect the method comprises depositing a layer of semi-insulating diamond on semi-insulating silicon carbide to provide a semi-insulating substrate for high frequency devices. Thereafter a second layer of diamond (or other material) is deposited on the semi-insulating layer to provide additional mechanical stability during wafer processing. The additional portion added for mechanical stability does not necessarily need to be semi-insulating because in this aspect the method comprises further processing the wafer (e.g., any appropriate or generic steps) with the second diamond (or other material) layer and thereafter removing portions (or all) of the second layer as the devices are finished. For example, the second layer can be added to provide mechanical stability during handling and a number of the epitaxial growth steps that result in heterojunction devices, but can then be removed prior to the step of opening via holes though the wafer or device.

The deposited second layer can also comprise another material selected for a complementary purpose. For example, a less expensive material can be selected provided it does not otherwise interfere with the other method steps or resulting device operation. Alternatively, a material can be selected to be somewhat easier to remove; e.g. silicon dioxide, silicon nitride. polycrystalline aluminum nitride, or silicon carbide.

With the diamond layer in place. the method next comprises preparing the opposite silicon carbide surface of the composite wafer for epitaxial growth thereon, and then adding a Group III nitride epilayer—and typically several layers including a heterojunction—to the prepared face (which will be the Si-face when the diamond has been deposited on the C-face). Preferably, the SiC surface is prepared by another CMP step.

Figure 2:
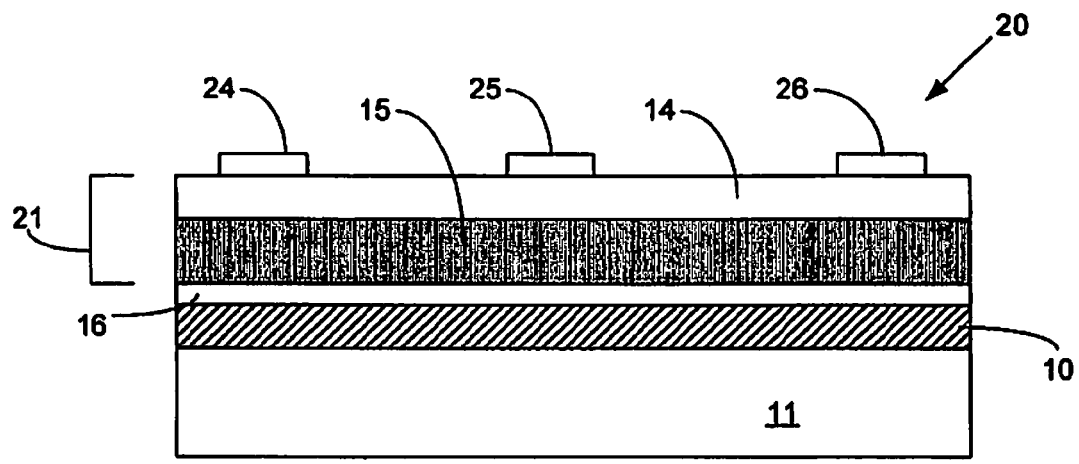
FIG. 2 is a cross-sectional schematic diagram of a device structure according to the present invention.
Figure 3:
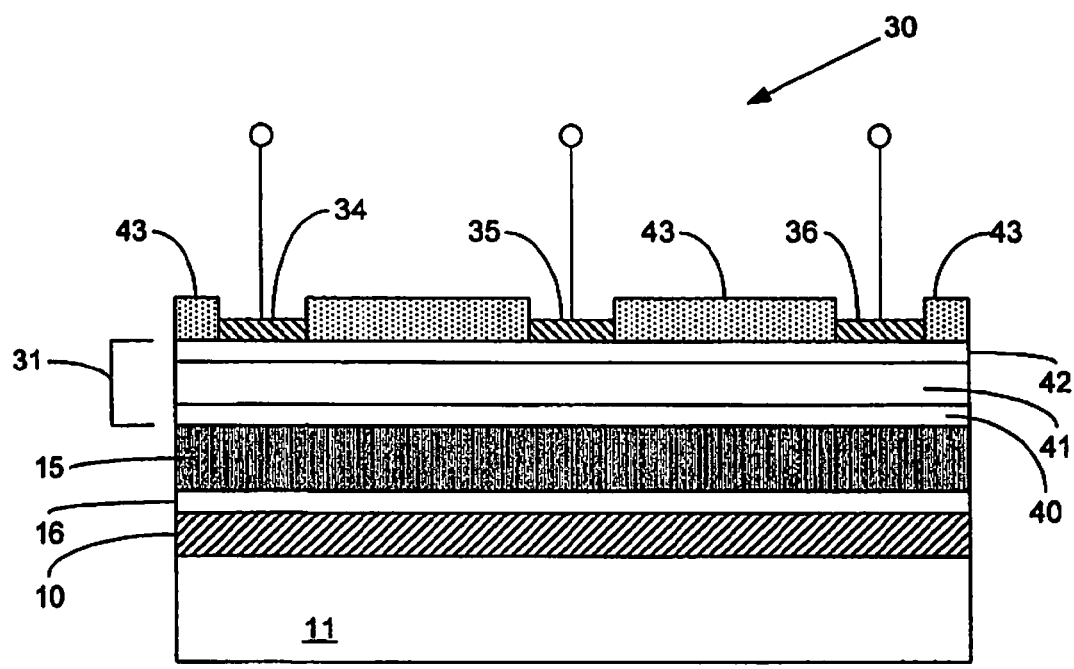
FIG. 3 is another cross-sectional view of another device according to the present invention.

FIGS. 2 and 3 illustrate devices that advantageously incorporate the present invention. Wherever possible, corresponding elements carry the same reference numerals in FIGS. 2 and 3 as in FIG. 1. Accordingly, FIG. 2 illustrates a high-power, high-frequency wide bandgap device broadly designated at 20 that exhibits reduced junction temperature and higher power density during operation and improved reliability at a rated power density. In this aspect, the invention comprises a diamond substrate 11 for providing a heat sink with a thermal conductivity greater than silicon carbide, and that will thus carry off more heat than an equivalent amount of SiC. A single crystal silicon carbide layer 10 is on the diamond substrate II for providing a crystal lattice match for wide bandgap material structures that is better than the crystal match of diamond. A Group 111 nitride heterostructure indicated by the brackets 21 is on the single crystal silicon carbide layer for providing device characteristics. FIG. 2 also illustrates the aluminum nitride buffer layer 16 which is preferably incorporated into the structure of the invention. It will accordingly be understood that when layers are referred to as being "on" one another, the term can encompass both layers that are directly in contact and those that are above one another with intermediate layers in between.

In a manner analogous to FIG. 1(E), the heterostructure 21 is in its most basic format formed of two different layers of Group III nitride such as the aluminum gallium nitride layer 14 and the gallium nitride layer 15. It will be understood, however, by those of relevant skill in this art that FIGS. 2 and 3 are schematic in nature and that more complex structures can be incorporated as desired or necessary, including double heterojunctions, barrier HEMTs, multiple quantum wells (MQWs), and superlattice structures. It will likewise be understood that when the singular term "layer" is used to describe portions of a Group III nitride device, it can include multiple layers that are commonly included in such devices for both manufacturing and operational purposes.

Additionally, those familiar with the Group III nitrides will recognize that the ternary Compounds such as AlGaN are more descriptively expressed as AlxGa1-xN where $0 \leq x \leq 1$ and that the respective mole fractions of aluminum and gallium (as expressed by x and 1-x) can be adjusted to provide desired or necessary properties. The tertiary Group III nitrides can be expressed in the same manner; e.g. InxAlyGa1-x-yN where $0 < x+y < 1$. Layers, junctions and devices formed of any of these materials can take advantage of the benefits offered by the present invention.

These formulas can also be written in "greater than or equal to" format (e.g., $0 \leq x \leq 1$) when the goal is to express a greater range of possibilities; e.g. AlxGax-1N where $0 \leq x \leq 1$ could represent AlN or GaN or AlGaN depending on the value of x.

In preferred embodiments, the diamond substrate 11 can be polycrystalline as this generally provides for less complex and less demanding manufacturing and thus helps increase manufacturing efficiency and reduce manufacturing costs.

Because a number of high frequency devices require semi-insulating substrates, in such embodiments the silicon carbide layer 10 is semi-insulating and if necessary depending upon the overall characteristics, the diamond substrate II may be semi-insulating as well. The nature and use of semi-insulating silicon carbide is set forth in exemplary (but not limiting) fashion in commonly assigned U.S. Pat. Nos. 6,218,680;

6,403,982; 6,396,080; 6,639,247 and 6,507,046; the contents of each of which are incorporated entirely herein by reference.

The silicon carbide typically has a polytype selected from the 3C, 4H, 6H and 15R polytypes of silicon carbide as these are the most widely available and suitable for electronic devices. Suitable substrates are commercially available from Cree, Inc. of Durham, N.C. (www.cree.com).

By adding the ohmic contacts 24 and 26 and the Schottky contact 25 to the heterostructure 21 (FIG. 2), a field effect transistor can be produced. In particular, by controlling the composition and doping of the epitaxial layers that form the heterostructure 21 a high frequency high electron mobility transistor (HEMT) can be produced.

Because the diamond substrate 11 of the device 20 provides a high thermal conductivity, the device can be advantageously packaged in (i.e., with or adjacent) a high thermal conductivity material. As used herein, the term "package" is used in its usual sense to refer to the container or structure in which an individual semiconductor device is contained for purposes of incorporating it into a larger circuit or an end use device. Indeed, because the thermal expansion of the device will be dominated by the thermal expansion coefficient of diamond, the package can further include or be formed of diamond as may be desired or necessary to minimize or eliminate stress from materials that are mis-matched in their thermal expansion and to take full advantage of the thermal conductivity of the device.

In this regard, the channels of HEMTs and related devices tend to generate the most heat during operation, particularly in the gate region. Thus the invention is particularly helpful in both spreading heat from the channel and also acting as a heat sink.

FIG. 3 illustrates a high electron mobility transistor (HEM1) in somewhat more detail and broadly designated at 30. The transistor 30 is formed of a diamond substrate II for providing the heat sink (or spreader) as discussed above. A semi-insulating layer of silicon carbide 10 is on the diamond substrate 11 for providing a favorable crystal growth surface for the Group III nitride epilayers. A buffer layer 16, typically or preferably formed of another Group III nitride such as aluminum nitride, is on the silicon carbide layer 10 and provides a crystal transition from the silicon carbide to the heterostructure. The heterostructure is formed of a first epitaxial layer 15 on the buffer 16 and a second epitaxial layer (or layers) indicated by the brackets 31 on the first epitaxial layer 15 for forming a heterojunction between the epilayers 15 and 31. In this embodiment, the Group III nitride of the second epilayer 31 has a wider bandgap than the first Group III nitride of the first epilayer 15 for generating a two-dimensional electron gas (2 DEG) in the first epilayer at the interface of the first and second epilayers 15 and 31. Respective source 34, gate 35 and drain 36 contacts provide a flow of the electrons between the source 34 and the drain 36 that is controlled by a voltage applied to the gate contact 35.

In certain embodiments, the first epitaxial layer 15 comprises gallium nitride and the second epitaxial layer 31 comprises aluminum gallium nitride. More preferably, the gallium nitride layer 15 is undoped and the aluminum gallium nitride layer 31 is doped n-type, for example with silicon (Si). As further illustrated in FIG. 3, the second epitaxial layer 31 includes two, and preferably three layers of aluminum gallium nitride that are respectively illustrated at 40, 41 and 42. Thus, in the more preferred embodiments the second epitaxial layer 31 comprises a doped layer 41 of aluminum gallium nitride and an undoped layer 40 of aluminum gallium nitride with the undoped layer 40 being adjacent the undoped layer 15 of gallium nitride. In yet a further embodiment, another undoped layer 42 of AlGaN is provided on top of the doped AlGaN layer 41. This structure is set forth and described in U.S. Pat. No. 6,583,454, which is commonly assigned with the present invention and which is incorporated entirely herein by reference. The use of an undoped layer of aluminum gallium nitride between the gallium nitride layer and the doped aluminum gallium nitride layer is referred to as a modulation-doped heterostructure and increases the mobility of electrons in the two-dimensional electron gas by physically separating the dopant in the aluminum gallium nitride layer from the undoped gallium nitride layer.

As set forth in U.S. Pat. No. 6,583,454, it has also been found that the transistor 30 operates more efficiently when a passivation layer 43 is included above the heterostructure formed by the layers 15 and 31. As further set forth in the '454 patent, the passivation material can be silicon dioxide (SiO2) or silicon nitride (Si3N4) provided that it has the relevant passivating characteristics.

As set forth in previously-incorporated published application No. 20020167023, the transistor can also incorporate a barrier layer for reducing gate leakage in the resulting device; or other layers (e.g. layers that improve the performance of the contact to p-type materials) for desired purposes, all while taking advantage of the present invention.

As with respect to the embodiment shown in FIG. 2, the transistor 30 of FIG. 3 can be packaged in a high thermal conductivity material, potentially including a diamond or diamond-containing package.

Figure 5:
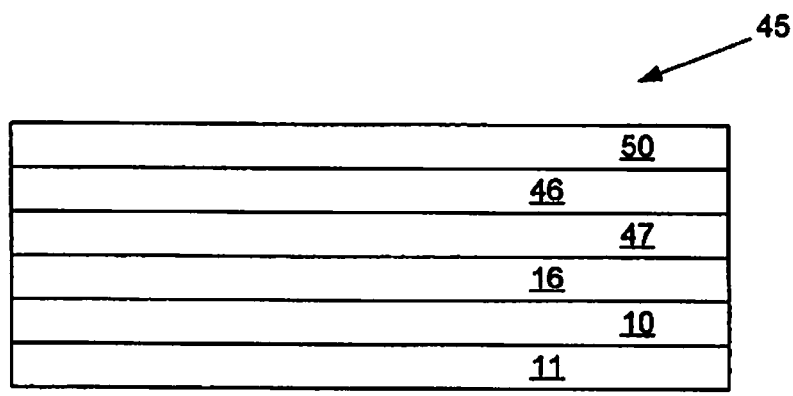
FIG. 5 is a schematic cross-sectional view of the major portions of a laser structure according to the present invention.

Although specifically discussed herein in terms of the high electron mobility transistor, the invention offers advantages in other devices for which improved thermal management offers advantages. Such other devices can include lasers, one of which is schematically illustrated in FIG. 5 at 45. The general theory and operation of semiconductor lasers is well understood by those of appropriate ("ordinary") skill in this art and need not be discussed in detail herein other than to note that the laser is typically formed of an active layer 46, bordered by respective clad layers 47 and 50. The nature of the materials for the clad layers—particularly their bandgaps and refractive indices—are preferably selected so that the active layer forms a potential well between the clad layers. Additionally, the refractive indexes of the clad layers 47 and 50 are preferably such that they encourage the light to remain confined in the active layer for resonance purposes. As in the previous embodiments, the diamond substrate is illustrated at 11 and the silicon carbide layer at 10 with an appropriate buffer layer 16 included as necessary. Generally, but not necessarily exclusively, lasers and light emitting diodes (LEDs) are more likely to include more complex structures such as multiple quantum wells and superlattice structures.

Figure 4:
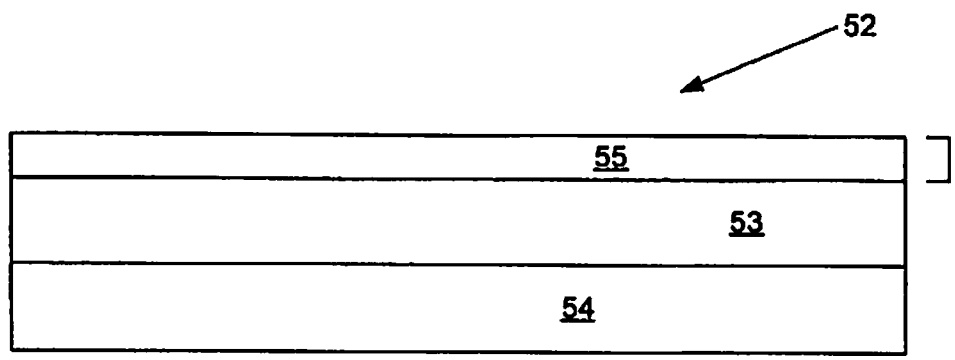
FIG. 4 is a cross-sectional view of a wafer precursor according to the present invention.

FIG. 4 is a schematic view of a wafer precursor according to the present invention. The wafer precursor is broadly designated at 52 and is included herein because the availability of large single crystal substrate wafers in silicon carbide—i.e., those of 2-inch, 3-inch, or 100 mm diameter (or equivalent metric sizes)—likewise provide the previously unavailable opportunity to, using the method of the invention, obtain diamond layers of this size for the heat sink purposes described herein. In this aspect, the invention is a substrate of single crystal silicon carbide 53 that is at least 2 inches in diameter. A layer of diamond 54 is on one face of the silicon carbide substrate 53 and a Group III nitride active structure designated by the brackets 55 is on the opposite face of the wafer 53. The substrate silicon carbide wafer 53 is preferably at least about 2 inches (5 centimeters (cm)) in diameter, more preferably at least 3 inches (7.5 cm) in diameter, and most preferably at least 4 inches (10 cm) in diameter. As set forth with respect to the other embodiments of the invention, the Group III nitride active structure 55 includes at least one heterostructure and the wafer precursor 52 can also include an appropriate buffer layer between the silicon carbide substrate and between the substrate and the heterostructure 55. For purposes of simplicity, the buffer layer it is not separately illustrated in FIG. 4. As in the previous embodiments, the silicon carbide can have a polytype selected from the group consisting of the 3C, 4H, 6H, and 15R polytypes of silicon carbide.

In the most preferred embodiments, the wafer includes a plurality of individual active structures on the silicon carbide substrate.

The invention has been primarily described herein with respect to the use of diamond as the heat sink material and silicon carbide as the substrate material. The invention can be understood in a broader aspect, however, in which a layer of higher thermal conductivity material is used in conjunction with a lower thermal conductivity material that has a better crystal lattice match with the Group III nitrides to produce a resulting composite wafer. In this aspect, the higher thermal conductivity materials can include metals and semiconductors such as boron nitride (BN), particularly cubic boron nitride ("cBN"), while the more preferred crystal substrate material can be selected from the group consisting of silicon, gallium nitride, aluminum nitride, aluminum gallium nitride, magnesium oxide (MgO), magnesium aluminate (MgAl2O4), lithium gallate (LiGaO2), lithium aluminate (LiAlO2), zinc oxide (ZnO), nickel aluminate (NiAl2O4), and sapphire, with AlGaN being more preferred. As in the previously-described embodiments, the presence of the higher thermal conductivity material as part of the substrate wafer favorably increases the thermal conductivity of the resulting composite wafer.

Cubic boron nitride ("cBN") is expected to have advantages in terms of its capability to be made semi-insulating, and for being processed for purposes of the invention in a manner similar to diamond. Boron nitride also has a higher thermal conductivity (13 W/cm-K) than silicon carbide.

For devices such as lasers and LEDs, a metal heat sink can be advantageous for reflection and light-extraction purposes. Suitable candidate metals can include Ni, Cr, Mn, W, Pt and relevant alloys of these metals. As noted above with respect to the diamond heat sink, the use of anyone or more of these metals or alloys should be consistent with the overall manufacture, structure, and operation of the resulting device.

As in the previous embodiments, the method of forming a device in such a composite wafer comprises reducing the thickness of the lower thermal conductivity portion of the composite wafer while retaining a sufficient thickness of the lower thermal conductivity portion to support the desired epitaxial growth thereon. The lower thermal conductivity surface is also prepared for epitaxial growth after which an appropriate Group III nitride epilayer, and typically a heterostructure, is added to the prepared face of the lower thermal conductivity portion of the wafer.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A wide bandgap device comprising:
    a first layer configured to provide mechanical stability for the wide bandgap device;
    a diamond layer on the first layer;
    a nitride buffer layer on the diamond layer;
    a first nitride layer directly on the nitride buffer layer; and
    a second nitride layer directly on the first nitride layer.

2. A wide bandgap device according to claim 1, wherein the nitride buffer layer comprises Aluminum Nitride.

3. A wide bandgap device according to claim 1, wherein the first nitride layer comprises Gallium Nitride.

4. A wide bandgap device according to claim 1, wherein the second nitride layer comprises Aluminum Gallium Nitride.

5. A wide bandgap device according to claim 1, wherein the wide bandgap device is a high electron mobility transistor.

6. A wide bandgap device according to claim 5, wherein the wide bandgap device includes source, gate, and drain contacts.

7. A wide bandgap device according to claim 5, wherein the second nitride layer forms a heterostructure with the first nitride layer.

8. A wide bandgap device according to claim 1, wherein the first layer is a material other than Aluminum Nitride.

9. A wide bandgap device comprising:
    a first layer configured to provide mechanical stability for the wide bandgap device;
    a diamond layer on the first layer;
    a nitride buffer layer on the diamond layer;
    a first nitride layer directly on the nitride buffer layer; and
    a second nitride layer directly on the first nitride layer for forming a hetero structure with the first nitride layer.

10. A wide bandgap device according to claim 9, wherein the nitride buffer layer comprises Aluminum Nitride.

11. A wide bandgap device according to claim 9, wherein the first nitride layer comprises Gallium Nitride.

12. A wide bandgap device according to claim 9, wherein the second nitride layer comprises Aluminum Gallium Nitride.

13. A wide bandgap device according to claim 9, wherein the wide bandgap device includes source, gate, and drain contacts.

* * * * *